United States Patent
Rajaee et al.

(10) Patent No.: US 9,608,658 B1
(45) Date of Patent: Mar. 28, 2017

(54) SEGMENTED SUCCESSIVE APPROXIMATION REGISTER (SAR) ANALOG-TO-DIGITAL CONVERTER (ADC) WITH REDUCED CONVERSION TIME

(71) Applicant: QUALCOMM Incorporated, San Diego, CA (US)

(72) Inventors: Omid Rajaee, San Diego, CA (US); Liang Dai, San Diego, CA (US); Ganesh Kiran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/014,865

(22) Filed: Feb. 3, 2016

Related U.S. Application Data

(60) Provisional application No. 62/232,554, filed on Sep. 25, 2015.

(51) Int. Cl.
  H03M 1/12    (2006.01)
  H03M 1/38    (2006.01)
  H03M 1/10    (2006.01)

(52) U.S. Cl.
  CPC .......... *H03M 1/38* (2013.01); *H03M 1/1009* (2013.01)

(58) Field of Classification Search
  CPC ........ H03M 1/468; H03M 1/804; H03M 1/46; H03M 1/12; H03M 1/38; H03M 1/164;
  (Continued)

(56) References Cited

U.S. PATENT DOCUMENTS

| | | | | |
|---|---|---|---|---|
| 5,691,722 A | * | 11/1997 | Wang | ...... H03M 1/42 341/155 |
| 6,239,734 B1 | * | 5/2001 | Bae | ...... H03M 1/144 341/163 |

(Continued)

FOREIGN PATENT DOCUMENTS

| | | |
|---|---|---|
| CN | 103873059 A | 6/2014 |
| CN | 104242935 A | 12/2014 |
| CN | 104320140 A | 1/2015 |

OTHER PUBLICATIONS

Van Der Goes F., et al., "A 1.5 mW 68 dB SNDR 80 Ms/s 2 Interleaved Pipelined SAR ADC in 28 nm CMOS," IEEE Journal of Solid-State Circuits, Dec. 2014, vol. 49 (12), pp. 2835-2845.
(Continued)

*Primary Examiner* — Linh Nguyen
(74) *Attorney, Agent, or Firm* — Patterson & Sheridan, L.L.P.

(57) ABSTRACT

Certain aspects of the present disclosure provide a segmented successive approximation register (SAR) analog-to-digital converter (ADC). One example ADC generally includes a plurality of SAR ADC circuits each associated with a different voltage range segment of a voltage range for the ADC. Each SAR ADC circuit is configured to receive an analog signal input to the ADC and to output a digital signal based on the analog signal, the digital signal being representative of a voltage level of the analog signal when the voltage level of the analog signal is within the segment associated with the SAR ADC circuit. In certain aspects, the SAR ADC may include logic configured to control a digital output of the ADC based on one or more of the digital signals representative of the voltage level of the analog signal output by one or more of the plurality of SAR ADC circuits.

25 Claims, 10 Drawing Sheets

(58) Field of Classification Search
CPC .......... H03M 1/069; H03M 1/00; H03M 1/10; H03M 1/1009
USPC ................ 341/118, 120, 155, 161, 163, 172
See application file for complete search history.

(56) References Cited

U.S. PATENT DOCUMENTS

| | | | |
|---|---|---|---|
| 7,671,777 B2 * | 3/2010 | Yamada | H03M 1/0675 341/143 |
| 8,159,382 B2 | 4/2012 | Srinivasa et al. | |
| 8,570,206 B1 * | 10/2013 | Lin | H03M 1/144 341/155 |
| 9,041,570 B2 | 5/2015 | Noguchi | |
| 9,331,706 B1 * | 5/2016 | Ranjbar | H03M 1/145 |
| 2004/0257256 A1 * | 12/2004 | Leung | H03M 1/1057 341/172 |
| 2008/0018517 A1 | 1/2008 | Yamada et al. | |
| 2009/0109079 A1 * | 4/2009 | Ahmad | H03M 1/069 341/156 |
| 2011/0241912 A1 * | 10/2011 | Doris | H03M 1/0614 341/110 |
| 2012/0146830 A1 * | 6/2012 | Jeon | H03M 1/164 341/172 |

OTHER PUBLICATIONS

International Search Report and Written Opinion—PCT/US2016/049396—ISA/EPO —Jul. 12, 2016.

* cited by examiner

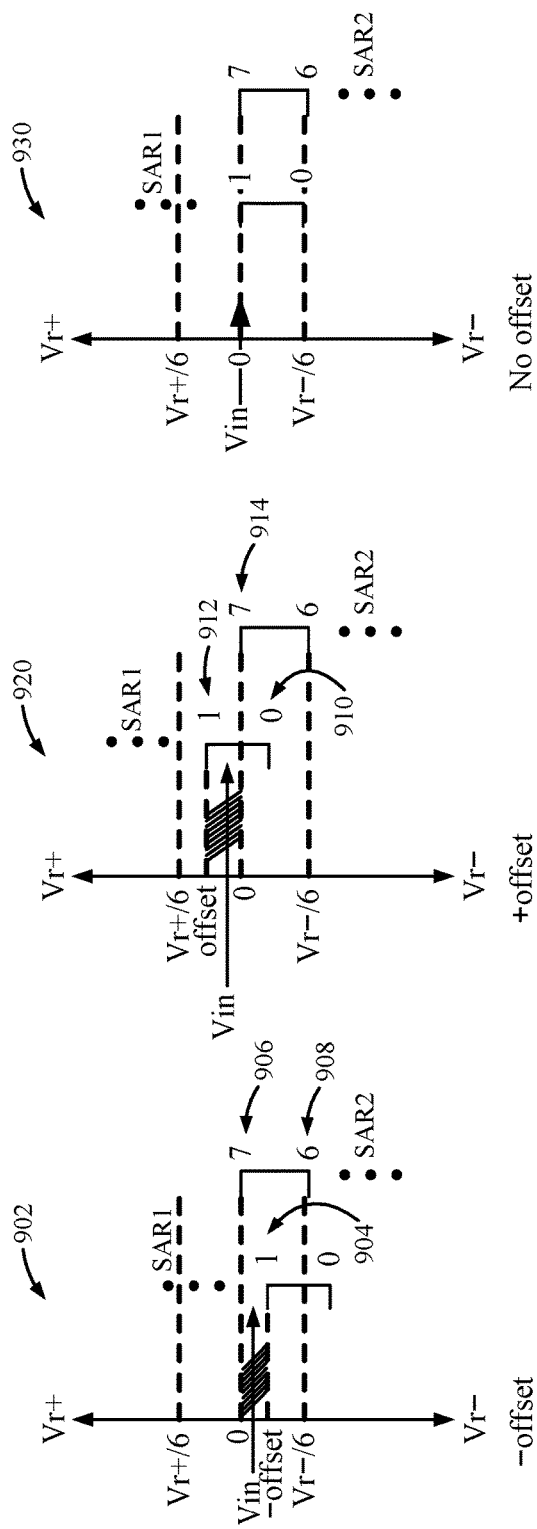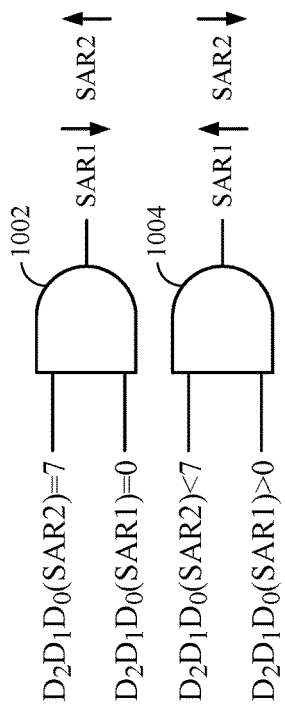
FIG. 9
FIG. 10

SEGMENTED SUCCESSIVE APPROXIMATION REGISTER (SAR) ANALOG-TO-DIGITAL CONVERTER (ADC) WITH REDUCED CONVERSION TIME

CLAIM OF PRIORITY UNDER 35 U.S.C. §119

The present application claims the benefit of U.S. Provisional Patent Application Ser. No. 62/232,554, entitled "SEGMENTED SUCCESSIVE APPROXIMATION REGISTER (SAR) ANALOG-TO-DIGITAL CONVERTER (ADC) WITH REDUCED CONVERSION TIME" and filed Sep. 25, 2015, which is assigned to the assignee of the present application and hereby expressly incorporated by reference herein in its entirety.

TECHNICAL FIELD

Certain aspects of the present disclosure generally relate to electronic circuits and, more particularly, to a segmented successive approximation register (SAR) analog-to-digital converter (ADC).

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System—Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

A mobile station or a base station may include one or more analog-to-digital converters (ADCs), for converting received, amplified, filtered, and downconverted analog signals to digital signals for additional processing in the digital domain, for example. Several types of ADCs are available, each with varying advantages and disadvantages. For example, a successive approximation register (SAR) ADC may provide an area and power-efficient architecture for low to medium accuracy analog-to-digital conversion applications. A SAR ADC may use a digital-to-analog converter (DAC) and a comparator to approximate a digital value corresponding to an analog input. Another type of ADC is referred to as a flash ADC, which may provide a faster conversion speed at the cost of an exponential increase in power and area consumption.

SUMMARY

Certain aspects of the present disclosure generally relate to a segmented successive approximation register (SAR) analog-to-digital converter (ADC) with reduced conversion time compared to conventional SAR ADCs.

Certain aspects of the present disclosure provide an ADC. The ADC generally includes a plurality of SAR ADC circuits, each associated with a different voltage range segment of a voltage range for the ADC, each SAR ADC circuit being configured to receive an analog signal input to the ADC and to output a digital signal based on the analog signal, the digital signal being representative of a voltage level of the analog signal when the voltage level of the analog signal is within the segment associated with the SAR ADC circuit; and logic configured to generate a digital output of the ADC based on one or more of the digital signals representative of the voltage level of the analog signal output by one or more of the plurality of SAR ADC circuits and the one or more segments associated therewith.

Certain aspects of the present disclosure provide a method for converting an analog signal to a digital signal using an analog-to-digital converter (ADC). The method generally includes receiving the analog signal input to the ADC at a plurality of successive approximation register (SAR) ADC circuits, wherein a voltage range for the ADC is divided into a plurality of segments, each segment of the voltage range associated with a different SAR ADC circuit; converting the received analog signal to a plurality of digital outputs in the plurality of successive approximation register (SAR) ADC circuits, wherein for each SAR ADC circuit, if a voltage level of the analog signal is within the segment associated with the SAR ADC circuit, the digital output from the SAR ADC circuit is representative of the voltage level of the analog signal; and outputting the digital signal from the ADC based on one or more of the digital outputs, representative of the voltage level of the analog signal, from one or more of the plurality of SAR ADC circuits and the one or more segments associated therewith.

Certain aspects of the present disclosure provide an apparatus for converting an analog signal to a digital signal. The apparatus generally includes a plurality of means for converting the analog signal to a digital output (e.g., using a successive approximation technique), wherein a voltage range for the analog signal is divided into a plurality of segments, each segment of the voltage range associated with a different one of the means for converting, and wherein each of the means for converting is configured to: receive the analog signal; and generate the digital output based on the analog signal, wherein if a voltage level of the analog signal is within the segment associated with the means for converting, the digital output from the means for converting is representative of the voltage level of the analog signal; and means for generating the digital signal output by the apparatus based on one or more of the digital outputs representative of the voltage level of the analog signal from one or more of the plurality of means for converting and one or more of the segments associated therewith.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 9 illustrates an example offset calibration technique for a segmented SAR ADC, according to certain aspects of the present disclosure.

FIG. 10 illustrates example offset detection logic used to detect positive or negative offset between overlapping segments of a segmented SAR ADC, according to certain aspects of the present disclosure.

DETAILED DESCRIPTION

Figure 1:
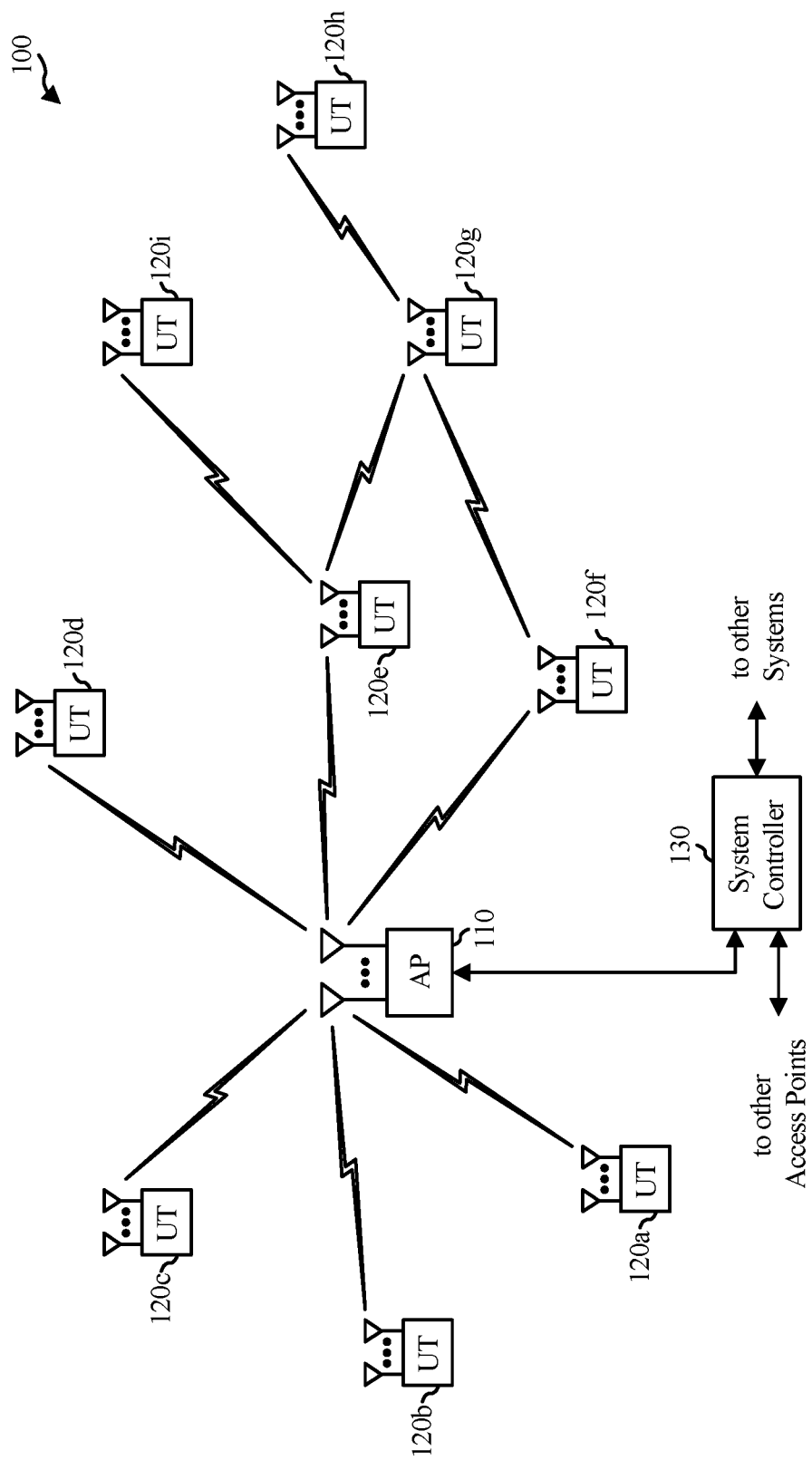
FIG. 1 is a diagram of an example wireless communications network, in accordance with certain aspects of the present disclosure.

Certain aspects of the present disclosure generally relate to an analog-to-digital converter (ADC) having multiple successive approximation register (SAR) ADC circuits, where a reference voltage range for the ADC is divided into two or more voltage segments and each voltage segment is covered by one of the SAR ADC circuits for conversion. This ADC architecture is generally referred to herein as a "segmented SAR ADC." Such a segmented SAR ADC has a lower conversion time and can be used for higher bandwidth and higher speed applications compared to conventional SAR ADCs.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include an analog-to-digital converter (ADC), which may be used, for example, to convert analog baseband signals to digital in-phase (I) or quadrature (Q) signals for digital signal processing. In certain aspects of the present disclosure, the ADC may include a plurality of successive approximation register (SAR) ADC circuits, each configured to process an analog signal with reference to a designated segment of a voltage range of the analog signal to increase conversion speed of the ADC.

Figure 2:
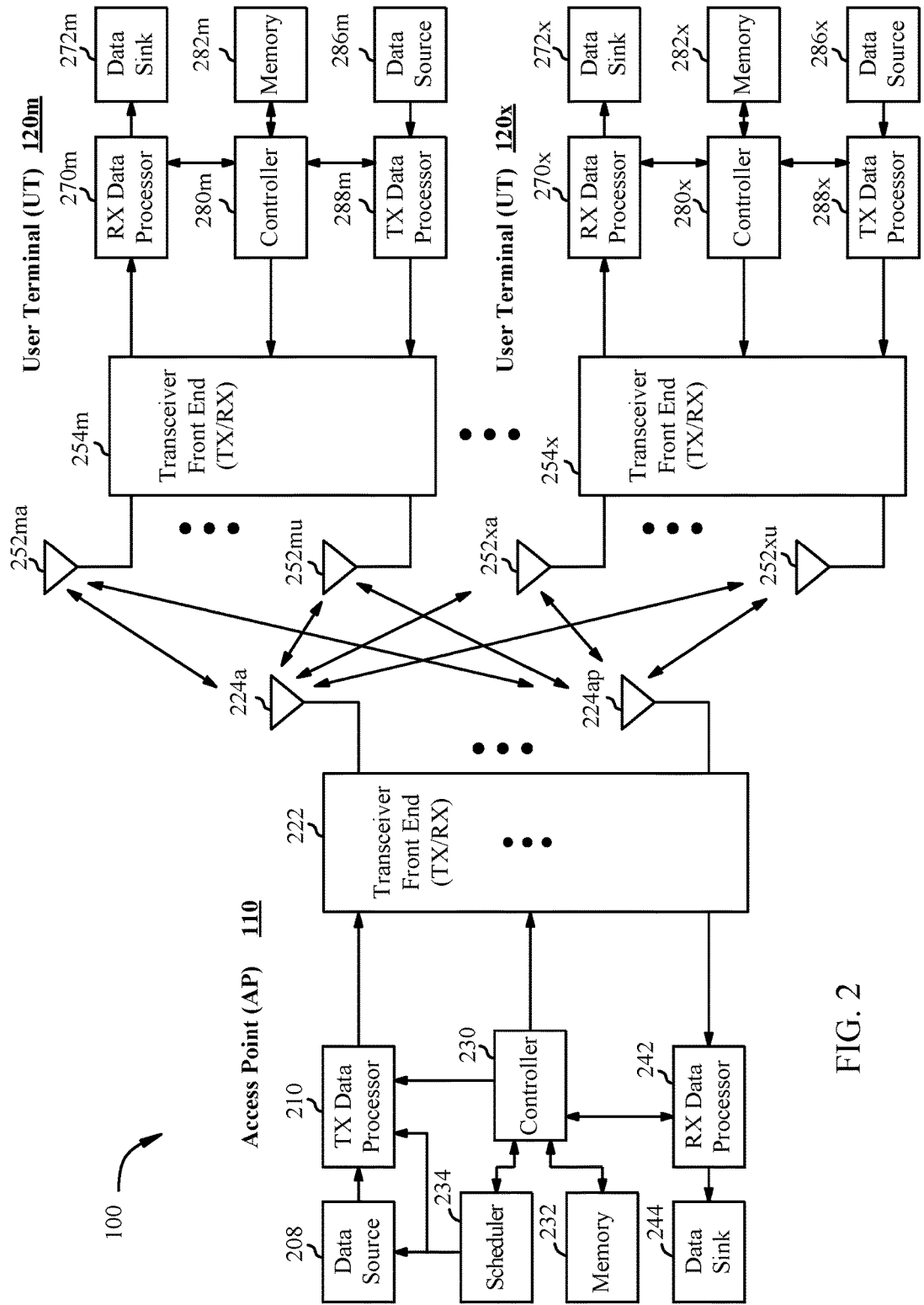
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver front end 254 of user terminal 120 may include an ADC, which may be used to convert baseband signals to digital I or Q signals for digital signal processing. In certain aspects of the present disclosure, the ADC may include a plurality of SAR ADC circuits, each configured to process the baseband signal with reference to a designated segment of a voltage range of the baseband signal to increase conversion speed of the ADC On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
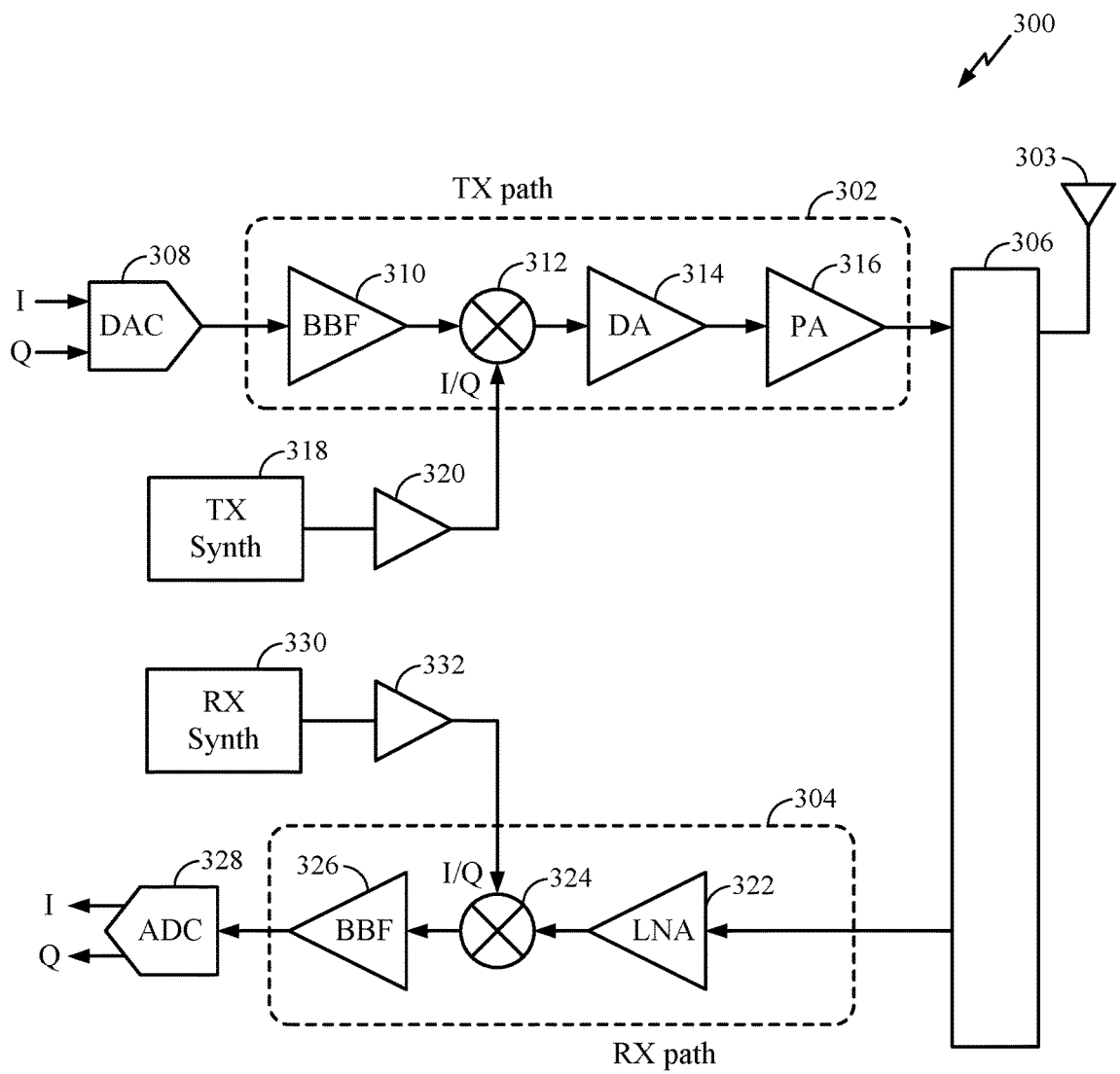
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing. In certain aspects of the present disclosure, the ADC 328 may include a plurality of SARs, each configured to process the baseband signal with reference to a designated segment of a voltage range of the baseband signal to increase conversion speed of the ADC 328.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Segmented SAR ADC

A successive approximation register (SAR) analog-to-digital converters (ADC) is an area- and power-efficient architecture for low to medium accuracy analog-to-digital conversion applications. Despite these benefits, SAR ADCs generally have a relatively slow conversion speed. For example, a flash ADC typically provides a faster conversion speed at the cost of an exponential increase in power and area consumption.

In order to resolve a number of bits (N) using a flash ADC, the flash ADC may use $2^N$ comparators, while a SAR ADC may use only one comparator, thereby saving area. On the other hand, a flash ADC is potentially faster than a SAR ADC by a factor of N. Thus, a SAR ADC may be effectively $2^N/N$ times more efficient than a flash ADC. Moreover, flash ADCs may be more prone to errors like comparator offset. That is, while a comparator offset may shift transfer characteristics of a SAR ADC, comparator offset may causes differential nonlinearity (DNL) error in a flash ADC.

Even though SAR ADCs are more power and area efficient as compared to flash ADCs, there are high-bandwidth and high-speed applications that SAR ADCs may not be able to satisfy due to a corresponding high conversion speed specification. Accordingly, what is needed are techniques and apparatus for converting analog signals to digital signals with relatively low area and power usage, but at higher conversion speeds than traditional SAR ADCs. Certain aspects of the present disclosure provide a segmented SAR ADC with increased conversion speed compared to conventional SAR ADCs by using two or more SAR ADC circuits to process an analog signal input to the ADC in parallel, where each SAR ADC circuit is designated a segment of a voltage range of the ADC for processing.

Figure 4:
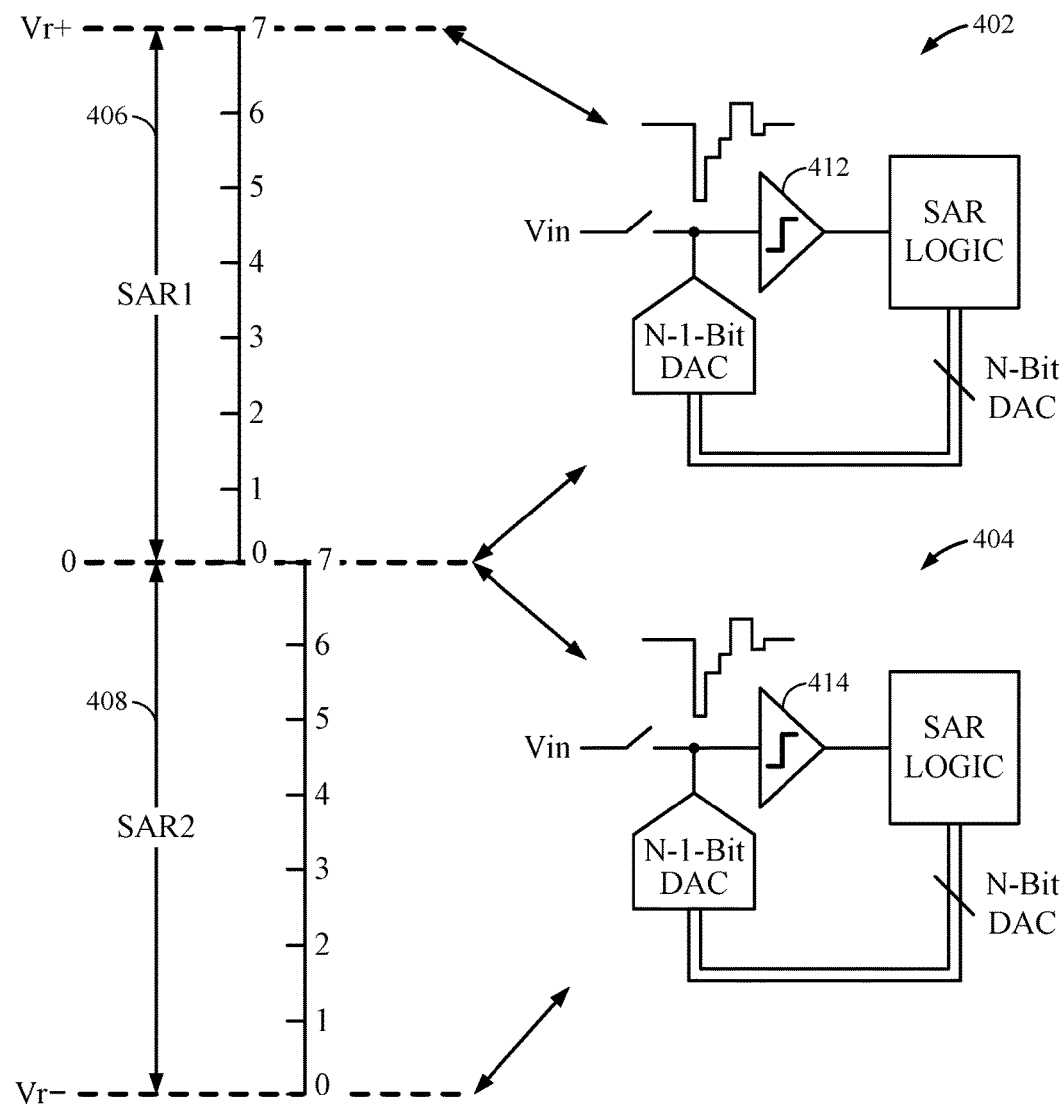
FIG. 4 illustrates an example segmented successive approximation register (SAR) analog-to-digital converter (ADC), in accordance with certain aspects of the present disclosure.

FIG. 4 conceptually illustrates an example segmented SAR ADC, in accordance with certain aspects of the present disclosure. As illustrated, an analog signal (Vin) input to the ADC may have a voltage range from −Vr to +Vr (within the reference voltage range of the ADC). Instead of using a single SAR ADC circuit to digitally represent Vin across the entire voltage range (e.g., −Vr to +Vr), multiple SAR ADC circuits may be used to convert Vin. More specifically, the voltage range may be divided into multiple segments, a first SAR ADC circuit 402 may be designated a first segment 406 of the voltage range, and a second SAR ADC circuit 404 may be designated a second segment 408. For example, the first segment 406 may range from zero volts (0) to +Vr, and the second segment 408 may range from −Vr to 0. The voltage rails of a comparator 412, 414 in each SAR ADC circuit 402, 404 may correspond to voltage limits of a segment assigned to the respective SAR ADC circuit.

Where the analog signal (Vin) is not within a segment designated to a particular SAR ADC circuit (e.g., first or second SAR circuit 402, 404), that SAR ADC circuit's digital output may be railed, either returning a zero value (e.g., all bits of the digital output are logic low) or saturating (e.g., all bits of the digital output may be logic high). For example, if the voltage level of Vin is within the first segment 406, the output of the second SAR circuit 404 may likely saturate, and the digital output of the first SAR ADC circuit may represent the voltage level of Vin. However, if the voltage level of Vin is within the second segment 408, the digital output of the first SAR ADC circuit 402 may be zero, and the output of the second SAR ADC circuit may represent the voltage level of Vin.

This technique of splitting the reference voltage range into segments and allocating a SAR ADC circuit to each segment allows each of the SAR ADC circuits to process the analog signal Vin with reference to a smaller voltage range and a fewer number of bits, thus increasing conversion speed. That is, a 4-bit segmented SAR ADC may be designed using two 3-bit SAR ADC circuits (e.g., the first and second SAR ADC circuits 402, 404). The two 3-bit SAR ADC circuits may be used to resolve the three least significant bits (LSBs) of the ADC's digital output, and the most significant bit (MSB) of the ADC's digital output may be determined based on whether the SAR circuits saturated or returned a zero-value digital output. For example, in a case where the second SAR ADC circuit 404 saturates, the MSB of the ADC's digital output may be set to logic high, and the digital output from the first SAR ADC circuit 402 may be used as the three LSBs of the ADC's digital output. The determination of the MSB may be made using a processor or other digital circuitry. Thus, a segmented SAR ADC with two segments as illustrated in FIG. 4 can use two 3-bit SAR ADC circuits that can generate an ADC digital output with a resolution of 4 bits, which may be performed at a sampling rate of 600 MHz, for example. However, the power consumption of such a segmented SAR ADC having two SAR ADC circuits may be increased by a factor of 1.5 times, for example, compared to a conventional single SAR ADC, unless a technique is used to reduce the power consumption.

Figure 5:
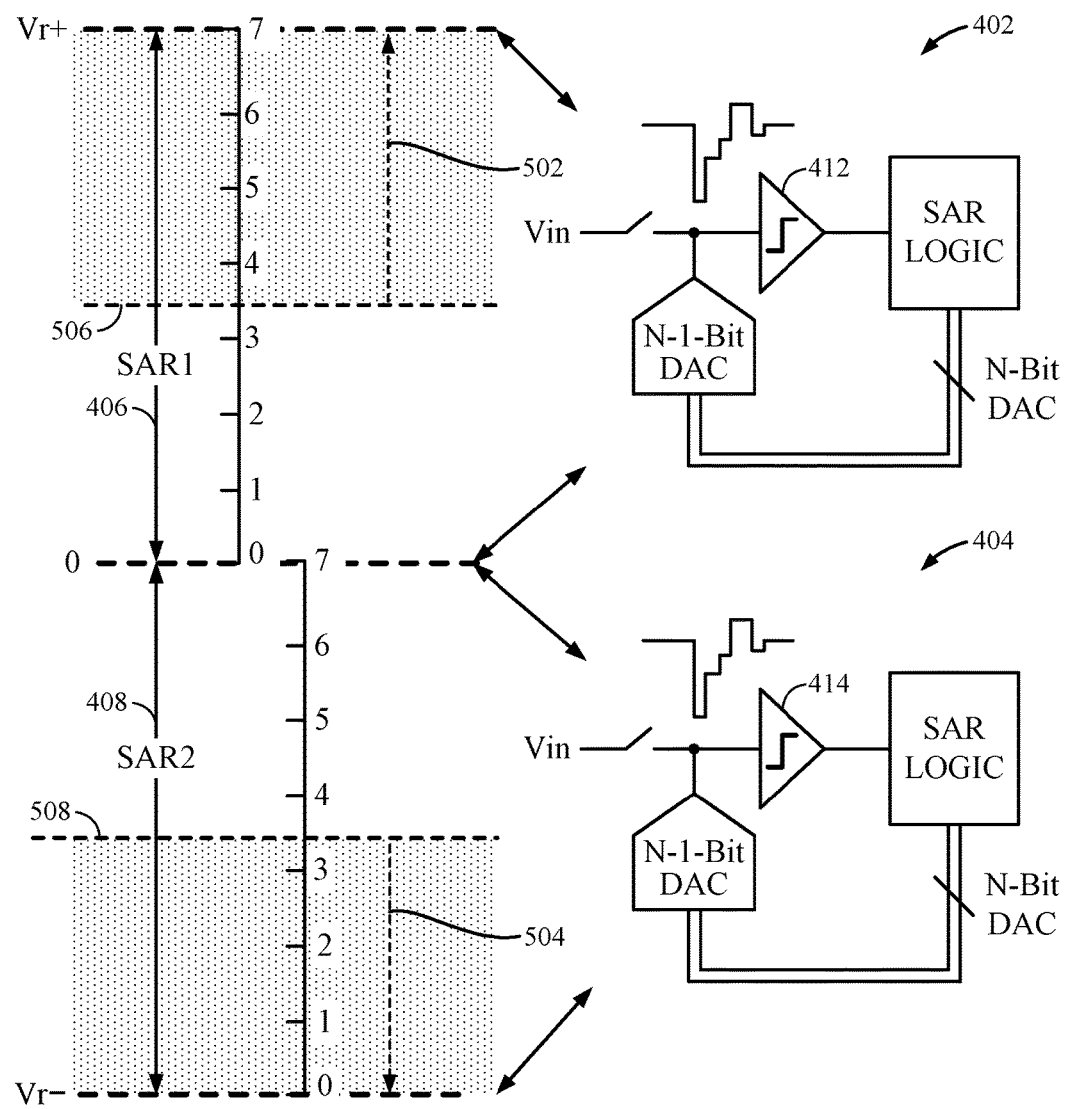
FIG. 5 illustrates an example technique to reduce the power consumption of the segmented SAR ADC of FIG. 4, according to certain aspects of the present disclosure.

FIG. 5 illustrates an example technique to reduce the power consumption of the segmented SAR ADC of FIG. 4, according to certain aspects of the present disclosure. As illustrated, each SAR ADC circuit (e.g., circuits 402, 404) may initially process the analog input signal (Vin) with reference to particular threshold voltage levels (e.g., thresholds 506, 508, respectively). That is, when determining a value for a MSB of its own digital output, the first SAR ADC circuit 402 may determine whether a voltage level of Vin is greater than or less than the threshold 506. For example, if the first SAR ADC circuit 402 determines that the voltage level of Vin is greater than the threshold 506, the second SAR ADC circuit 404 may be deactivated (e.g., temporarily powered down) and, for certain aspects, the MSB of the digital output from the first SAR ADC circuit 402 may be set to a logic high. Similarly, the second SAR ADC circuit 404 may determine whether a voltage level of Vin is greater than or less than the threshold 508. For example, if the second SAR ADC circuit 404 determines that the voltage level of Vin is lower than the threshold 508, the first SAR ADC circuit 402 may be deactivated and, for certain aspects, the MSB of the digital output from the second SAR ADC circuit 404 may be set to logic low. Thus, one of the first SAR ADC circuit 402 or the second SAR ADC circuit 404 may be deactivated to reduce power consumption if the voltage level of Vin falls within the shaded areas illustrated in FIG. 5.

For example, if the first SAR ADC circuit 402 makes a determination that a voltage level of Vin is greater than threshold 506 (e.g., falls within range 502), it can be determined that Vin is not within the second segment 408 assigned to the second SAR ADC circuit 404. Therefore, the second SAR ADC circuit 404 may be deactivated to reduce power consumption of the ADC until another sample of Vin is to be processed. Similarly, if the second SAR ADC circuit 404 determines that the voltage level of Vin is less than the threshold 508 (e.g., falls within range 504), then it can be determined that Vin is not within the first segment 406 assigned to the first SAR ADC circuit 402, and thus, the first SAR ADC circuit 402 may be deactivated to reduce power consumption of the ADC. In other words, once it is determined that a voltage level of Vin does not fall within a segment of the voltage range assigned to an individual SAR ADC circuit after the MSB of that particular SAR ADC circuit has been resolved, the respective SAR ADC circuit may be deactivated and does not continue to resolve the remaining bits of its digital output.

If the first SAR ADC circuit 402 determines that Vin is less than the threshold 506 and the second SAR ADC circuit 404 determines that Vin is greater than the threshold 508, both the first SAR ADC circuit 402 and the second SAR ADC circuit 404 may stay active because the voltage level of Vin may still be within a segment designated to either one of the first SAR ADC circuit 402 or the second SAR ADC circuit 404. However, an opportunity may still exist to deactivate one of the first or second SAR ADC circuit 402, 404 to reduce power consumption of the ADC after resolution of a following bit of the ADC digital output, as described with reference to FIG. 6.

Figure 6:
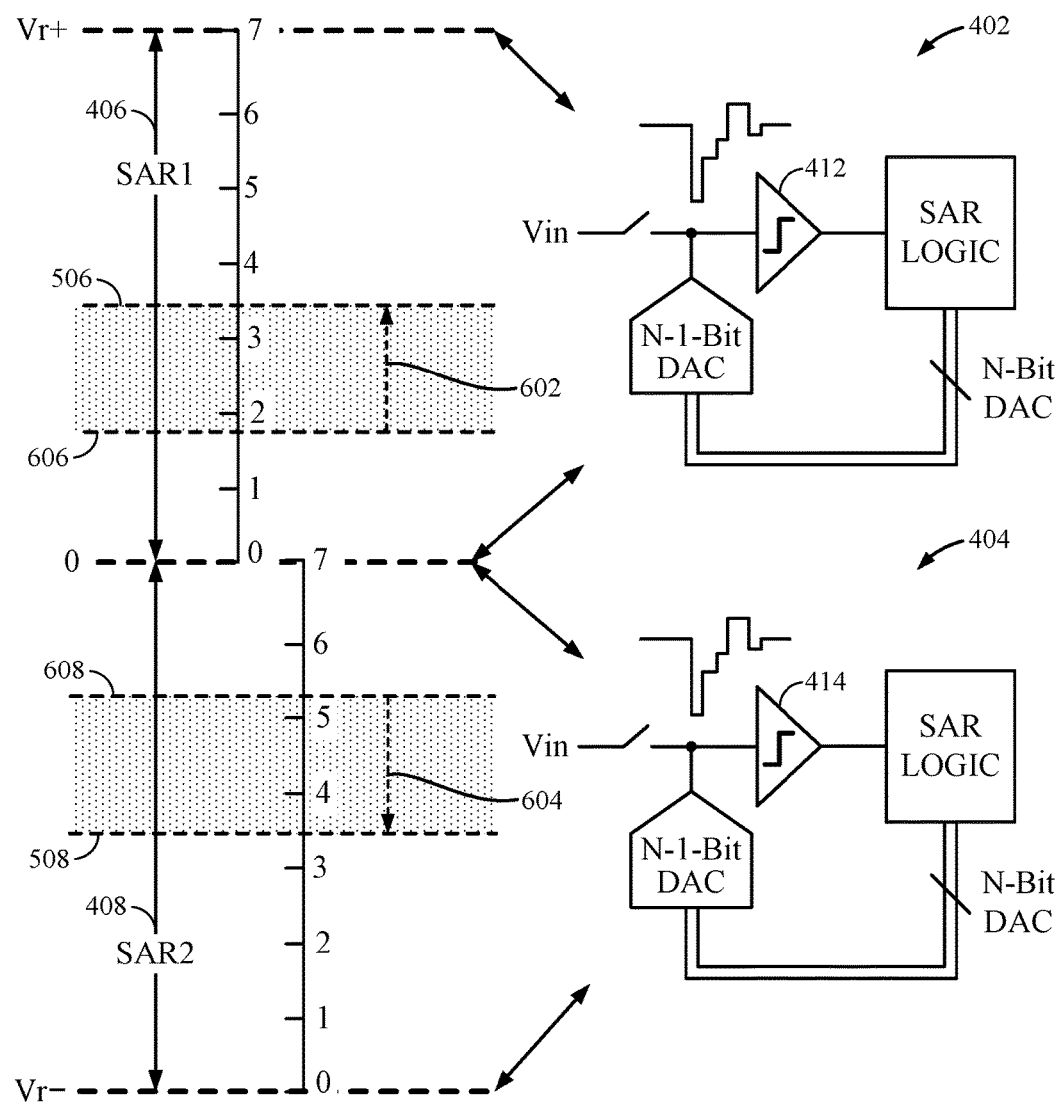
FIG. 6 illustrates another example technique to reduce power consumption of the segmented SAR ADC of FIG. 4 after a second conversion of an individual SAR ADC circuit, according to certain aspects of the present disclosure.

FIG. 6 illustrates another example technique to reduce power consumption of the segmented SAR ADC of FIG. 4, according to certain aspects of the present disclosure. As illustrated, after the first SAR ADC circuit 402 has determined that the voltage level of Vin is less than the threshold 506 (e.g., MSB of digital output of the first SAR ADC circuit 402 is logic low) as described with reference to FIG. 5, the first SAR ADC circuit 402 may determine whether the voltage level of Vin is less than or greater than a threshold 606 (e.g., to resolve the next bit of its digital output). In this case, if the first SAR ADC circuit 402 determines that the voltage level of Vin is greater than the threshold 606, it can be determined that the amplitude of Vin is between the thresholds 606 and 506 (e.g., in the range 602), and thus, does not fall within the second segment 408 assigned to the second SAR ADC circuit 404. Thus, the second SAR ADC circuit 404 may be deactivated to reduce the power consumption of the ADC.

Similarly, if the second SAR ADC circuit 404 has determined that the voltage level of Vin is greater than the threshold 508 (e.g., MSB of digital output of the second SAR ADC circuit 404 is logic high) as described with reference to FIG. 5, the second SAR ADC circuit 404 may determine whether the voltage level of Vin is less than or greater than a threshold 608. In this case, if the second SAR ADC circuit 404 determines that the voltage level of Vin is less than the threshold 608, it can be determined that the amplitude of Vin is between the thresholds 508 and 608 (e.g., in the range 604), and thus, does not fall within the first segment 406 assigned to the first SAR ADC circuit 402. Thus, the first SAR ADC circuit 402 may be deactivated to reduce the power consumption of the ADC.

Where the first SAR ADC circuit 402 determines that the voltage level of Vin is less than the threshold 606 and the second SAR ADC circuit 404 determines that the voltage level of Vin is greater than the threshold 608, neither the first SAR ADC circuit 402 nor the second SAR ADC circuit 404 may be deactivated. However, the first SAR ADC circuit 402 or the second SAR ADC circuit 404 may be deactivated in a similar manner during a following comparison of Vin to resolve the remaining bits of the respective SAR ADC circuit.

Figure 7:
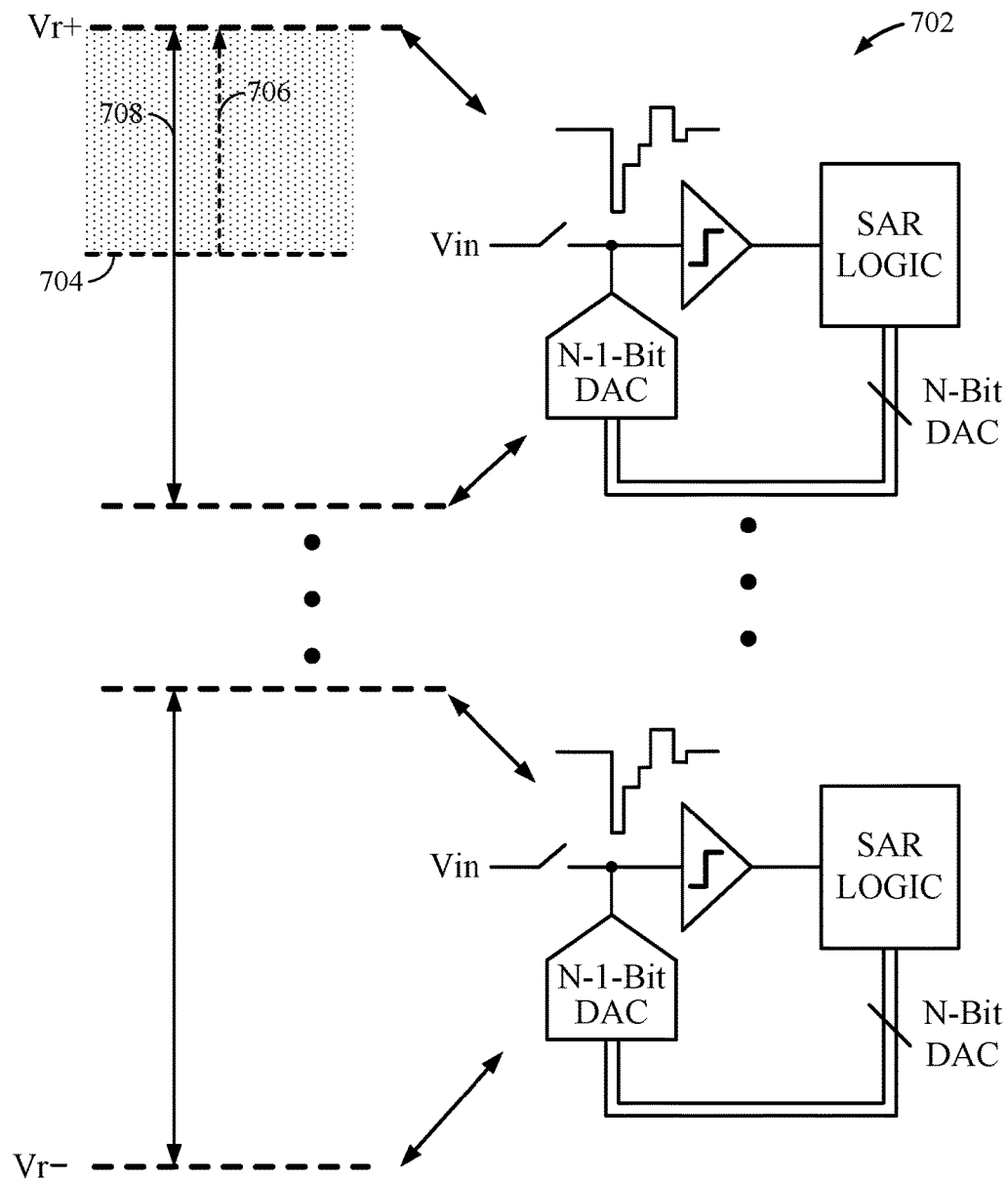
FIG. 7 illustrates an example segmented SAR ADC with more than two segments and more than two corresponding SAR ADC circuits, according to certain aspects of the present disclosure.

FIG. 7 illustrates an example segmented SAR ADC technique with more than two segments and more than two corresponding SAR ADC circuits, according to certain aspects of the present disclosure. For example, the voltage range (e.g., Vr+ to Vr−) may be divided into $2^M$ segments where one SAR ADC circuit is used for each segment. Each SAR ADC circuit may resolve N bits and thus, a total of N+M bits may be resolved for the segmented SAR ADC, in which $2^M$ individual SAR ADC circuits are used. In this case, the conversion time of the multi-segment SAR ADC may be N×$t_s$ where $t_s$ is the amount of time for each SAR ADC circuit to resolve one bit. The M MSBs of the ADC may be resolved by a processor or other digital circuitry associated with the ADC, as described above.

Moreover, after the MSB of each individual SAR ADC circuit is resolved, all but one or two SAR ADC circuits may be deactivated in an effort to reduce power consumption. For example, if SAR ADC circuit 702 determines that the voltage level of Vin is greater than a threshold 704 (e.g., within a voltage range 706), all (or another desired combination of) the other SAR ADC circuits may be deactivated to reduce power consumption. However, where SAR ADC circuit 702 determines that the voltage level of Vin is less than the threshold 704, not all other SAR ADC circuits should be deactivated. Instead, where another SAR ADC circuit (not shown) assigned a segment adjacent to segment 708 determines that the voltage level of Vin is greater than a another threshold (e.g., within the adjacent segment), then it can be determined that the voltage level of Vin is within segment 708 or the adjacent segment. Thus, all (or another desired combination of) the other SAR ADC circuits may be deactivated, except the SAR ADC circuit 702 and the SAR ADC circuit assigned to the adjacent segment.

With multiple SAR ADC circuits, the number of conversions performed by the multi-segment SAR ADC may be $2^M$×N. However, by using the power reduction techniques described herein, the number of conversions may be reduced from $2^M$×N to $2^M$+N−1 if all but one SAR ADC circuit is deactivated after a first bit of the digital output from the SAR ADC circuits is resolved. Where all but two SAR ADC circuits are deactivated after a first bit of the digital output from the SAR ADC circuits is resolved, the number of conversions may be reduced from $2^M$×N to $2^M$+2N−2.

Certain aspects of the present disclosure provide techniques to prevent missing code or differential nonlinearity (DNL) errors, which may be caused by offset differences between the SAR ADC circuits. That is, the offset differences between the SAR ADC circuits can shift the trip point of a SAR ADC circuit (e.g., the first SAR ADC circuit 402) away from a trip point of an adjacent segment assigned to another SAR ADC circuit (e.g., the second SAR ADC circuit 404).

Figure 8:
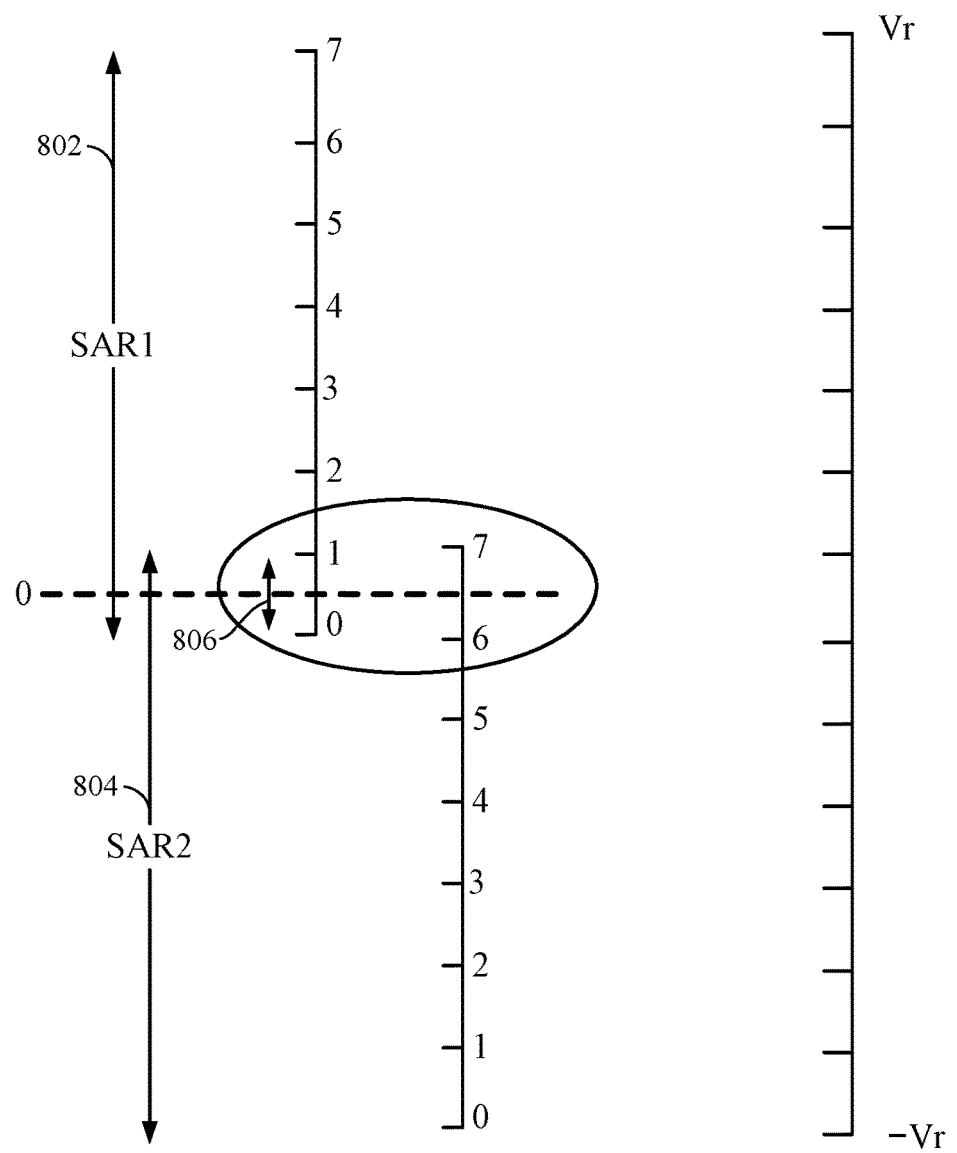
FIG. 8 conceptually illustrates example overlapping segments assigned to two SAR ADC circuits of a segmented SAR ADC, according to certain aspects of the present disclosure.

FIG. 8 conceptually illustrates example overlapping segments assigned to two SAR ADC circuits of a segmented SAR ADC, according to certain aspects of the present disclosure. This technique of overlapping adjacent segments assigned to corresponding SAR ADC circuits may prevent missing code or DNL errors in the segmented SAR ADC. For example, a segment 802 assigned to a first SAR ADC circuit 402 (e.g., SAR 1) may overlap with a segment 804 assigned to a second SAR ADC circuit 404 (e.g., SAR2). In certain aspects, the amount of overlap between segments 802 and 804 may be a portion 806 of the segment 802 (or segment 804) representing a resolution of the SAR circuits (e.g., the voltage range represented by one LSB of the ADC's digital output). Moreover, the offset of the comparator of each SAR ADC circuit may be limited to half of the voltage range represented by portion 806 (e.g., one half LSB). Consequently, the comparator offset should not cause a missing code error.

FIG. 9 illustrates an example offset calibration technique for preventing missing code or DNL errors for a segmented SAR ADC, according to certain aspects of the present disclosure. As described above with respect to FIG. 8, segments 802 and 804 may intentionally overlap by a portion 806. However, voltage offset differences may exist between the comparators of SAR ADC circuits having adjacent segments, leading to an offset from the desired overlapping portion (e.g., one LSB). This offset may be detected using a logic circuit and corrected, or at least adjusted, in real time (e.g., without a separate calibration phase).

Diagram 902 illustrates a case where negative offset exists between a trip point (e.g., trip point 904) of a first SAR ADC circuit (e.g., SAR1) relative to a trip point (e.g., trip point 906) of a second SAR ADC circuit (e.g., SAR2). In this scenario, the first SAR ADC circuit may generate a digital output representing the decimal value of 1 as the voltage level (Vin) of the analog input signal is greater than the trip point 904 of the first SAR ADC circuit. However, the second SAR ADC circuit may generate a digital output representing the decimal value of 6 because the voltage level of Vin is between trip points 906 and 908, as shown.

Diagram 920 illustrates a case where positive offset exists between a trip point (e.g., trip point 912) of a first SAR ADC circuit (e.g., SAR1) relative to a trip point (e.g., trip point 914) of a second SAR ADC circuit (e.g., SAR2). In this scenario, the first SAR ADC circuit may generate a digital output representing the decimal value of 0 because the voltage level of Vin is between the trip points 910 and 912, as shown. However, the second SAR ADC circuit may generate a digital output representing a decimal value of 7 (e.g., a saturated output) because the voltage level of Vin is greater than the trip point 914.

These scenarios illustrated with diagrams 902 and 920 may be detected using the digital outputs of the first and second SAR ADC circuits to determine whether negative or positive offset exists, and then the offset of comparators in the first and/or second SAR ADC circuits may be adjusted accordingly. That is, if the voltage level of Vin moves around the overlapped trip points, the overlap mismatch (i.e., the offset from the desired overlap) can be detected by means of simple logic (e.g., AND gates), and this information can be used to correct the corresponding offset. Thus, the offset of comparators in the first and/or second SAR circuits may be adjusted until the desired offset (e.g., one LSB) is achieved, as illustrated in diagram 930 where the trip points of the first SAR ADC circuit are aligned with the trip points of the second SAR ADC circuit.

FIG. 10 illustrates example offset detection logic used to detect positive and/or negative offsets between overlapping segments of a segmented SAR ADC, according to certain aspects of the present disclosure. The offset detection logic may be part of the offset calibration circuit. As illustrated, an AND gate 1002 may be used to determine when a digital output of a first SAR ADC circuit (e.g., SAR1) is saturated (e.g., the highest binary value for this circuit) and a digital output of a second SAR ADC circuit (e.g., SAR2) is zero (i.e., the lowest binary value for this circuit). For example, the first and second SAR ADC circuits may be 3-bit SAR ADC circuits having digital outputs corresponding to bits $D_0$, $D_1$, and $D_2$. The AND gate 1002 may be used to detect when the output of the first SAR circuit is saturated (e.g., $D_0$, $D_1$, and $D_2$ are all logic high) and the output of the second SAR circuit is zero (e.g., $D_0$, $D_1$, and $D_2$ are all logic low). If this situation is detected (e.g., the output of the AND gate 1002 is logic high), the offset of the first SAR ADC circuit may be reduced, and/or the offset of the second SAR ADC circuit may be increased.

Similarly, another AND gate 1004 may be used to detect when the output of the first SAR ADC circuit is greater than zero (e.g., not the lowest binary value) and the output of the second SAR ADC circuit is not saturated (e.g., less than a corresponding decimal value 7 for a 3-bit SAR ADC circuit). If this situation is detected (e.g., the output of the AND gate 1004 is logic high), the offset of the first SAR ADC circuit may be increased, and/or the offset of the second SAR ADC circuit may be decreased. In certain aspects, several misaligned occurrences as detected by AND gate 1002 or 1004 may be used (e.g., averaged) to correct, or at least adjust, the offset of the first and second SAR ADC circuits (e.g., the offset of the SAR ADC comparators) in order to smooth out any noise that might otherwise cause inaccurate offset detection and adjustment.

Figure 11:
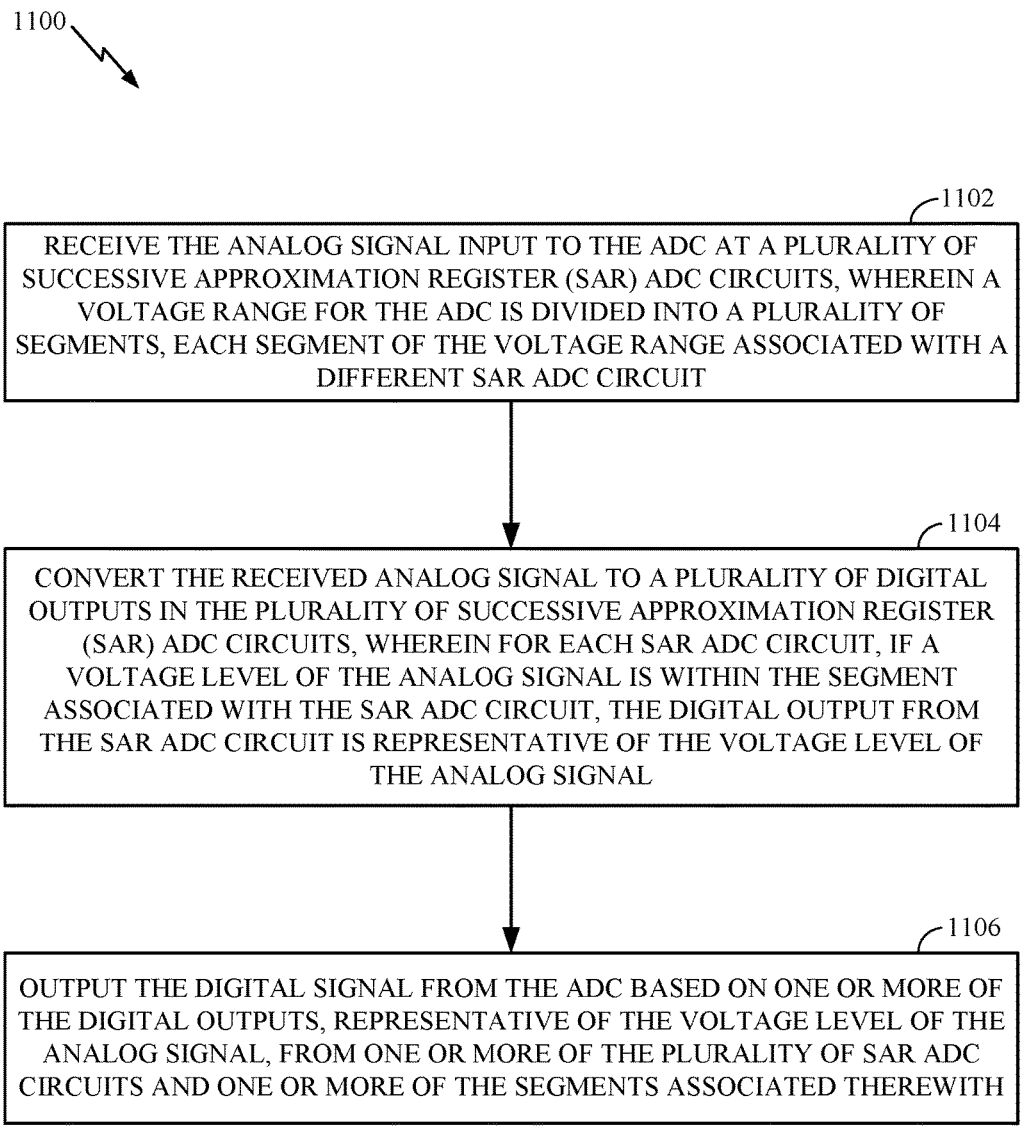
FIG. 11 is a flow diagram of example operations for converting an analog signal to a digital signal, in accordance with certain aspects of the present disclosure.

FIG. 11 is a flow diagram of example operations 1100 for converting an analog signal to a digital signal, in accordance with certain aspects of the present disclosure. The operations 1100 may be performed by a segmented SAR ADC, such as the ADC 328 of FIG. 3.

The operations 1100 may begin, at block 1102, with the ADC receiving the analog signal and distributing the received analog signal to a plurality of SAR ADC circuits. A voltage range for the ADC is divided into a plurality of segments, and each segment of the voltage range is associated with a different SAR ADC circuit. In certain aspects, the plurality of segments comprise equal portions of the voltage range (i.e., the voltage range is divided into equal segments).

At block 1104, the ADC, and more specifically, the plurality of SAR ADC circuits, convert the received analog signal to a plurality of digital outputs. For each SAR ADC circuit, if a voltage level of the analog signal is within the segment associated with the SAR ADC circuit, the digital output from the SAR ADC circuit is representative of the voltage level of the analog signal. At block 1106, the ADC outputs the digital signal based on one or more of the digital outputs, representative of the voltage level of the analog signal, from one or more of the plurality of SAR ADC circuits and one or more of the segments associated therewith.

In certain aspects, for each SAR ADC circuit, in the converting at block 1104, if the voltage level of the analog signal is outside the segment associated with the SAR ADC circuit, the digital output from the SAR ADC circuit is railed (e.g., all binary 0's or all binary 1's). In other aspects, for each SAR ADC circuit, in the converting at block 1104, if the voltage level of the analog signal is outside the segment associated with the SAR ADC circuit, the digital output from the SAR ADC circuit is forced to a predetermined value (e.g., binary 0).

According to certain aspects, the operations 1100 may further include deactivating a first SAR ADC circuit of the plurality of SAR ADC circuits based on whether the voltage level of the analog signal is less than or greater than a voltage threshold within one of the plurality of segments associated with a second SAR ADC circuit of the plurality of SAR ADC circuits. In certain aspects, the one of the plurality of segments associated with the second SAR ADC circuit has a lower voltage range than another one of the segments associated with the first SAR ADC circuit. In this case, deactivating the first SAR ADC circuit is based on the voltage level of the analog signal being less than the voltage threshold within the one of the plurality of segments associated with the second SAR ADC circuit. In other aspects, the one of the plurality of segments associated with the second SAR ADC circuit has a higher voltage range than another one of the plurality of segments associated with the first SAR ADC circuit. In this case, deactivating the first SAR ADC circuit is based on the voltage level of the analog signal being greater than the voltage threshold within the one of the plurality of segments associated with the second SAR ADC circuit.

According to certain aspects, the operations 1100 further include overlapping a portion of one of the plurality of segments associated with a first SAR ADC circuit of the plurality of SAR ADC circuits with another one of the plurality of segments associated with a second SAR ADC circuit of the plurality of SAR ADC circuits. In certain aspects, the portion equals a resolution voltage (e.g., a least significant bit (LSB) voltage) of the ADC.

According to certain aspects, the operations 1100 further include calibrating one or more offsets between the plurality of SAR ADC circuits such that a portion of one of the plurality of segments associated with a first SAR ADC circuit of the plurality of SAR ADC circuits overlaps with another one of the plurality of segments associated with a second SAR ADC circuit of the plurality of SAR ADC circuits. In certain aspects, the portion equals a resolution voltage of the ADC. In certain aspects, calibrating the one or more offsets is based on the digital outputs from the first SAR ADC circuit and the second SAR ADC circuit. In certain aspects, the other one of the plurality of segments associated with the second SAR ADC circuit has a lower voltage range than the one of the plurality of segments associated with the first SAR ADC circuit. In this case, calibrating the one or more offsets may involve: determining that the digital output from the first SAR ADC circuit represents a minimum voltage within the one of the plurality of segments associated with the first SAR ADC circuit and the digital output from the second SAR ADC circuit represents a maximum voltage within the other one of the plurality of segments associated with the second SAR ADC circuit; and at least one of decreasing a voltage offset corresponding to the first SAR ADC circuit or increasing a voltage offset corresponding to the second SAR ADC circuit, based on the determination. Additionally or alternatively in this case, calibrating the one or more offsets may entail: determining that the digital output from the first SAR ADC circuit represents a value greater than a minimum voltage within the one of the plurality of segments associated with the first SAR ADC circuit and the digital output from the second SAR ADC circuit represents a value less than a maximum voltage within the other one of the plurality of segments associated with the second SAR ADC circuit; and at least one of increasing a voltage offset corresponding to the first SAR ADC circuit or decreasing a voltage offset corresponding to the second SAR ADC circuit, based on the determination.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front end 300 depicted in FIG. 3). Means for receiving may comprise a receiver (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front end 300 depicted in FIG. 3). Means for processing, means for deactivating, means for calibrating, means for decreasing, means for increasing, and/or means for determining may comprise a processing system, which may include one or more processors (e.g., the TX data processor 210, the RX data processor 242, and/or the controller 230 of the access point 110 shown in FIG. 2, or the RX data processor 270, the TX data processor 288, and/or the controller 280 of the user terminal 120 illustrated in FIG. 2). Means for converting may comprise a SAR ADC circuit (e.g., first SAR ADC circuit 402 shown FIG. 4). Means for calibrating, means for decreasing, and/or means for increasing may also comprise a calibration circuit (e.g., offset detection logic comprising AND gates 1002, 1004 illustrated in FIG. 10) and/or a comparator (e.g., comparator 412 depicted in FIG. 4).

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. In addition, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An analog-to-digital converter (ADC) comprising:
a plurality of successive approximation register (SAR) ADC circuits, each associated with a different voltage range segment of a voltage range for the ADC, each SAR ADC circuit being configured to:
receive an analog signal input to the ADC; and
output a digital signal based on the analog signal, the digital signal being representative of a voltage level of the analog signal when the voltage level of the analog signal is within the segment associated with the SAR ADC circuit; and
logic configured to generate a digital output of the ADC based on one or more of the digital signals, representative of the voltage level of the analog signal, output by one or more of the plurality of SAR ADC circuits and the respective voltage range segment associated with each of the one or more of the plurality of SAR ADC circuits, wherein a first SAR ADC circuit of the plurality of SAR ADC circuits is deactivated based on whether the voltage level of the analog signal is less than or greater than a voltage threshold within one of the segments associated with a second SAR ADC circuit of the plurality of SAR ADC circuits.

2. The ADC of claim 1, wherein each SAR ADC circuit is further configured to rail the digital signal when the voltage level of the analog signal is outside the segment associated with the SAR ADC circuit.

3. The ADC of claim 1, wherein voltage magnitudes of the segments are equal.

4. The ADC of claim 1, wherein:
the one of the segments associated with the second SAR ADC circuit has a lower voltage range than another one of the segments associated with the first SAR ADC circuit; and
the first SAR ADC circuit is deactivated based on the voltage level of the analog signal being less than the voltage threshold within the one of the segments associated with the second SAR ADC circuit.

5. The ADC of claim 1, wherein a portion of one of the segments associated with a first SAR ADC circuit of the plurality of SAR ADC circuits overlaps with another one of the segments associated with a second SAR ADC circuit of the plurality of SAR ADC circuits.

6. The ADC of claim 5, wherein the portion is a resolution voltage of the ADC.

7. The ADC of claim 1, further comprising a calibration circuit configured to calibrate one or more offsets between the plurality of SAR ADC circuits such that a portion of one of the segments associated with a first SAR ADC circuit of the plurality of SAR ADC circuits overlaps with another one of the segments associated with a second SAR ADC circuit of the plurality of SAR ADC circuits, wherein the portion is a resolution voltage of the ADC.

8. The ADC of claim 7, wherein the calibration circuit is configured to calibrate the one or more offsets based on the digital signals output by the first SAR ADC circuit and the second SAR ADC circuit.

9. The ADC of claim 8, wherein:
the other one of the segments associated with the second SAR ADC circuit has a lower voltage range than the one of the segments associated with the first SAR ADC circuit; and
the calibration circuit is configured to calibrate the offsets with:
a determination that the digital signal output by the first SAR ADC circuit represents a minimum voltage within the one of the segments associated with the first SAR ADC circuit and the digital signal output by the second SAR ADC circuit represents a maximum voltage within the other one of the segments associated with the second SAR ADC circuit; and
at least one of a decrease in a voltage offset corresponding to the first SAR ADC circuit or an increase in a voltage offset corresponding to the second SAR ADC circuit, based on the determination.

10. The ADC of claim 8, wherein:
the other one of the segments associated with the second SAR ADC circuit has a lower voltage range than the one of the segments associated with the first SAR ADC circuit; and
the calibration circuit is configured to calibrate the offsets with:
a determination that the digital signal output by the first SAR ADC circuit represents a value greater than a minimum voltage within the one of the segments associated with the first SAR ADC circuit and the digital signal output by the second SAR ADC circuit represents a value less than a maximum voltage within the other one of the segments associated with the second SAR ADC circuit; and
at least one of an increase in a voltage offset corresponding to the first SAR ADC circuit or a decrease in a voltage offset corresponding to the second SAR ADC circuit, based on the determination.

11. The ADC of claim 1, wherein for each SAR ADC circuit, if the voltage level of the analog signal is outside the segment associated with the SAR ADC circuit, the digital signal output by the SAR ADC circuit is forced to a predetermined value.

12. A method for converting an analog signal to a digital signal using an analog-to-digital converter (ADC), comprising:
receiving the analog signal input to the ADC at a plurality of successive approximation register (SAR) ADC circuits, wherein a voltage range for the ADC is divided into a plurality of segments, each segment of the voltage range associated with a different SAR ADC circuit;
converting the received analog signal to a plurality of digital outputs in the plurality of SAR ADC circuits, wherein for each SAR ADC circuit, if a voltage level of the analog signal is within the segment associated with the SAR ADC circuit, the digital output from the SAR ADC circuit is representative of the voltage level of the analog signal;
outputting the digital signal from the ADC based on one or more of the digital outputs, representative of the voltage level of the analog signal, from one or more of the plurality of SAR ADC circuits and the respective voltage range segment associated with each of the one or more of the plurality of SAR ADC circuits; and
deactivating a first SAR ADC circuit of the plurality of SAR ADC circuits based on whether the voltage level of the analog signal is less than or greater than a voltage threshold within one of the segments associated with a second SAR ADC circuit of the plurality of SAR ADC circuits.

13. The method of claim 12, wherein for each SAR ADC circuit, in the converting, if the voltage level of the analog signal is outside the segment associated with the SAR ADC circuit, the digital output from the SAR ADC circuit is railed.

14. The method of claim 12, wherein the voltage magnitudes of the plurality of segments are equal.

15. The method of claim 12, further comprising calibrating one or more offsets between the plurality of SAR ADC circuits such that a portion of one of the plurality of segments associated with a first SAR ADC circuit of the plurality of SAR ADC circuits overlaps with another one of the plurality of segments associated with a second SAR ADC circuit of the plurality of SAR ADC circuits, wherein the portion equals a resolution voltage of the ADC.

16. The method of claim 15, wherein calibrating the one or more offsets is based on the digital outputs from the first SAR ADC circuit and the second SAR ADC circuit.

17. The method of claim 16, wherein:
the other one of the plurality of segments associated with the second SAR ADC circuit has a lower voltage range than the one of the plurality of segments associated with the first SAR ADC circuit; and
calibrating the one or more offsets comprises:
determining that the digital output from the first SAR ADC circuit represents a minimum voltage within the one of the plurality of segments associated with the first SAR ADC circuit and the digital output from the second SAR ADC circuit represents a maximum voltage within the other one of the plurality of segments associated with the second SAR ADC circuit; and
at least one of decreasing a voltage offset corresponding to the first SAR ADC circuit or increasing a voltage offset corresponding to the second SAR ADC circuit, based on the determination.

18. The method of claim 15, wherein:
the other one of the plurality of segments associated with the second SAR ADC circuit has a lower voltage range than the one of the plurality of segments associated with the first SAR ADC circuit; and
calibrating the one or more offsets comprises:
determining that the digital output from the first SAR ADC circuit represents a value greater than a minimum voltage within the one of the plurality of segments associated with the first SAR ADC circuit and the digital output from the second SAR ADC circuit represents a value less than a maximum voltage within the other one of the plurality of segments associated with the second SAR ADC circuit; and
at least one of increasing a voltage offset corresponding to the first SAR ADC circuit or decreasing a voltage offset corresponding to the second SAR ADC circuit, based on the determination.

19. The method of claim 12, wherein for each SAR ADC circuit, in the converting, if the voltage level of the analog signal is outside the segment associated with the SAR ADC circuit, the digital output from the SAR ADC circuit is forced to a predetermined value.

20. An apparatus for converting an analog signal to a digital signal, comprising:
a plurality of means for converting the analog signal to a digital output, wherein a voltage range for the analog signal is divided into a plurality of segments, each segment of the voltage range associated with a different one of the means for converting, and wherein each of the means for converting is configured to:
receive the analog signal; and
generate the digital output based on the analog signal, wherein if a voltage level of the analog signal is within the segment associated with the means for converting, the digital output from the means for converting is representative of the voltage level of the analog signal;
means for generating the digital signal output by the apparatus based on one or more of the digital outputs, representative of the voltage level of the analog signal, from one or more of the plurality of means for converting and the respective voltage range segment associated with each of the one or more of the plurality of means for converting; and
means for deactivating a first means for converting of the plurality of means for converting based on whether the voltage level of the analog signal is less than or greater than a voltage threshold within one of the plurality of segments associated with a second means for converting of the plurality of means for converting.

21. The apparatus of claim 20, wherein a portion of one of the plurality of segments associated with a first means for converting of the plurality of means for converting overlaps with another one of the plurality of segments associated with a second means for converting of the plurality of means for converting.

22. The apparatus of claim 20, further comprising means for calibrating one or more offsets between the plurality of means for converting such that a portion of one of the plurality of segments associated with a first means for converting of the plurality of means for converting overlaps with another one of the plurality of segments associated with a second means for converting of the plurality of means for converting, and wherein the portion is a resolution voltage of the apparatus.

23. The apparatus of claim 22, wherein the means for calibrating is configured to calibrate the one or more offsets based on the digital outputs from the first means for converting and the second means for converting.

24. The apparatus of claim 23, wherein:
the other one of the plurality of segments associated with the second means for converting has a lower voltage range than the one of the plurality of segments associated with the first means for converting; and
the means for calibrating is configured to:
determine that the digital output from the first means for converting represents a minimum voltage within the one of the plurality of segments associated with the first means for converting and the digital output from the second means for converting represents a maximum voltage within the other one of the plurality of segments associated with the second means for converting; and
at least one of decrease a voltage offset corresponding to the first means for converting or increase a voltage offset corresponding to the second means for converting, based on the determination.

25. The ADC of claim 1, wherein the logic is configured to determine a value of at least one most significant bit of the digital output based on the segment associated with each of the one or more of the plurality of SAR ADC circuits.

* * * * *